United States Patent
Kim

(10) Patent No.: US 10,186,662 B2
(45) Date of Patent: Jan. 22, 2019

(54) MASK FRAME ASSEMBLY FOR DEPOSITION AND METHOD OF MANUFACTURING DISPLAY APPARATUS USING THE SAME

(71) Applicant: Samsung Display Co., Ltd., Yongin-si, Gyeonggi-do (KR)

(72) Inventor: Yonghwan Kim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/416,148

(22) Filed: Jan. 26, 2017

(65) Prior Publication Data
US 2017/0222145 A1 Aug. 3, 2017

(30) Foreign Application Priority Data
Jan. 29, 2016 (KR) .................. 10-2016-0011832

(51) Int. Cl.
*B05C 21/00* (2006.01)
*H01L 51/00* (2006.01)
*H01L 51/56* (2006.01)

(52) U.S. Cl.
CPC ........ *H01L 51/0011* (2013.01); *B05C 21/005* (2013.01); *H01L 51/56* (2013.01)

(58) Field of Classification Search
None
See application file for complete search history.

(56) References Cited

U.S. PATENT DOCUMENTS

| 2003/0108805 A1* | 6/2003 | Clark .................... C23C 14/042 430/22 |
| 2004/0020435 A1* | 2/2004 | Tsuchiya ............... C23C 14/042 118/723 VE |
| 2015/0101536 A1 | 4/2015 | Han |
| 2015/0165464 A1 | 6/2015 | Baek |

FOREIGN PATENT DOCUMENTS

| KR | 1020070090018 A | 9/2007 |
| KR | 1020100101436 A | 9/2010 |
| KR | 1020140127781 A | 11/2014 |
| KR | 1020150042600 A | 4/2015 |
| KR | 1020150071320 A | 6/2015 |

* cited by examiner

*Primary Examiner* — Jethro M. Pence
(74) *Attorney, Agent, or Firm* — Cantor Colburn LLP

(57) ABSTRACT

A mask frame assembly for deposition includes: a frame including an opening portion; a first support extending in a first direction across the opening portion and including opposing ends in the first direction which are each coupled to the frame; a mask stick through which a deposition material passes to a plurality of display regions of a substrate, the mask stick disposed on the first support and extending in a second direction crossing the first direction, the mask stick including: opposing ends in the second direction which are each coupled to the frame, and a deposition region common to each of the plurality of display regions of the substrate; and a magnet coupled to the first support and overlapping the deposition region of the mask stick.

12 Claims, 5 Drawing Sheets

MASK FRAME ASSEMBLY FOR DEPOSITION AND METHOD OF MANUFACTURING DISPLAY APPARATUS USING THE SAME

This application claims priority to Korean Patent Application No. 10-2016-0011832, filed on Jan. 29, 2016, and all the benefits accruing therefrom under 35 U.S.C. § 119, the contents of which in their entirety are herein incorporated by reference.

BACKGROUND

1. Field

One or more exemplary embodiment relates to a mask frame assembly and a method of manufacturing a display apparatus using the same, and more particularly, to a mask frame assembly in which a relatively complex pattern may be formed and a method of manufacturing a display apparatus using the mask frame assembly in which the relatively complex pattern may be formed.

2. Description of the Related Art

As information technology has developed, the market has grown for display apparatuses which connect users and information. Such display apparatuses are being developed in various forms, and from among them, organic light-emitting display apparatuses are gaining attention as excellent display apparatuses due to their relatively low power consumption as well as their relatively slim and lightweight design.

SUMMARY

One or more exemplary embodiment of relates to a mask frame assembly for deposition in which a relatively complex pattern may be formed having a relatively high resolution, and a method of manufacturing a display apparatus using the mask frame assembly.

According to one or more exemplary embodiment, a mask frame assembly includes: a frame including an opening portion; a first support extending in a first direction across the opening portion and including opposing ends in the first direction each coupled to the frame; a mask stick through which a deposition material passes to a plurality of display regions of a substrate, the mask stick disposed on the first support and extending in a second direction crossing the first direction, the mask stick including opposing ends in the second direction each coupled to the frame and a deposition region common to each of the plurality of display regions of the substrate; and a magnet coupled to the first support and overlapping the deposition region.

The magnet may be between the deposition region of the mask stick and the first support.

A surface of the support facing the deposition region of the mask stick may have a magnet groove or magnet slot, and the magnet may be in the magnet groove or magnet slot.

The surface of the support facing the deposition region of the mask stick and a surface of the magnet facing the deposition region of the mask stick may be coplanar with each other.

A width of the first support may be defined in the second direction. A surface of the support facing the deposition region of the mask stick may have a magnet groove or magnet slot extended across a portion of the width of the first support, and remaining portion of the width of the first support may define a blocking portion of the first support. The magnet may be in the magnet groove or magnet slot, and an edge of the blocking portion may be aligned with an edge of the support extending in the first direction. The blocking region may restrict movement of the magnet in the second direction.

A surface of the support facing the deposition region of the mask stick, a surface of the magnet facing the deposition region of the mask stick, and a surface of the frame facing the mask stick may be coplanar with each other.

The mask frame assembly may further include a second support below the mask stick, the second support extending in the second direction across the support and including opposing ends in the second direction each coupled to the frame.

The second support may be between the first support and the frame.

The frame may include first supporting grooves opposing each other in the first direction with respect to the opening portion and second supporting grooves opposing each other in the second direction with respect to the opening portion. The opposing ends of the first support may be respectively inserted in the first supporting grooves, and the opposing ends of the second support may be respectively inserted in the second supporting grooves. From a same surface of the frame which faces the mask stick, a depth of the first supporting grooves may be less than that of the second supporting grooves.

A length of the first support in the first direction may be greater than that of the second support in the second direction.

The mask stick may include a ferromagnetic material.

According to one or more exemplary embodiments, a method of manufacturing a display apparatus includes: preparing a substrate including a plurality of display regions on which a deposition material is disposed; and depositing the deposition material at the plurality of display regions of the substrate by using the mask frame assembly.

BRIEF DESCRIPTION OF THE DRAWINGS

These and/or other features will become apparent and more readily appreciated from the following description of the exemplary embodiments, taken in conjunction with the accompanying drawings in which.

DETAILED DESCRIPTION

Figure 1:
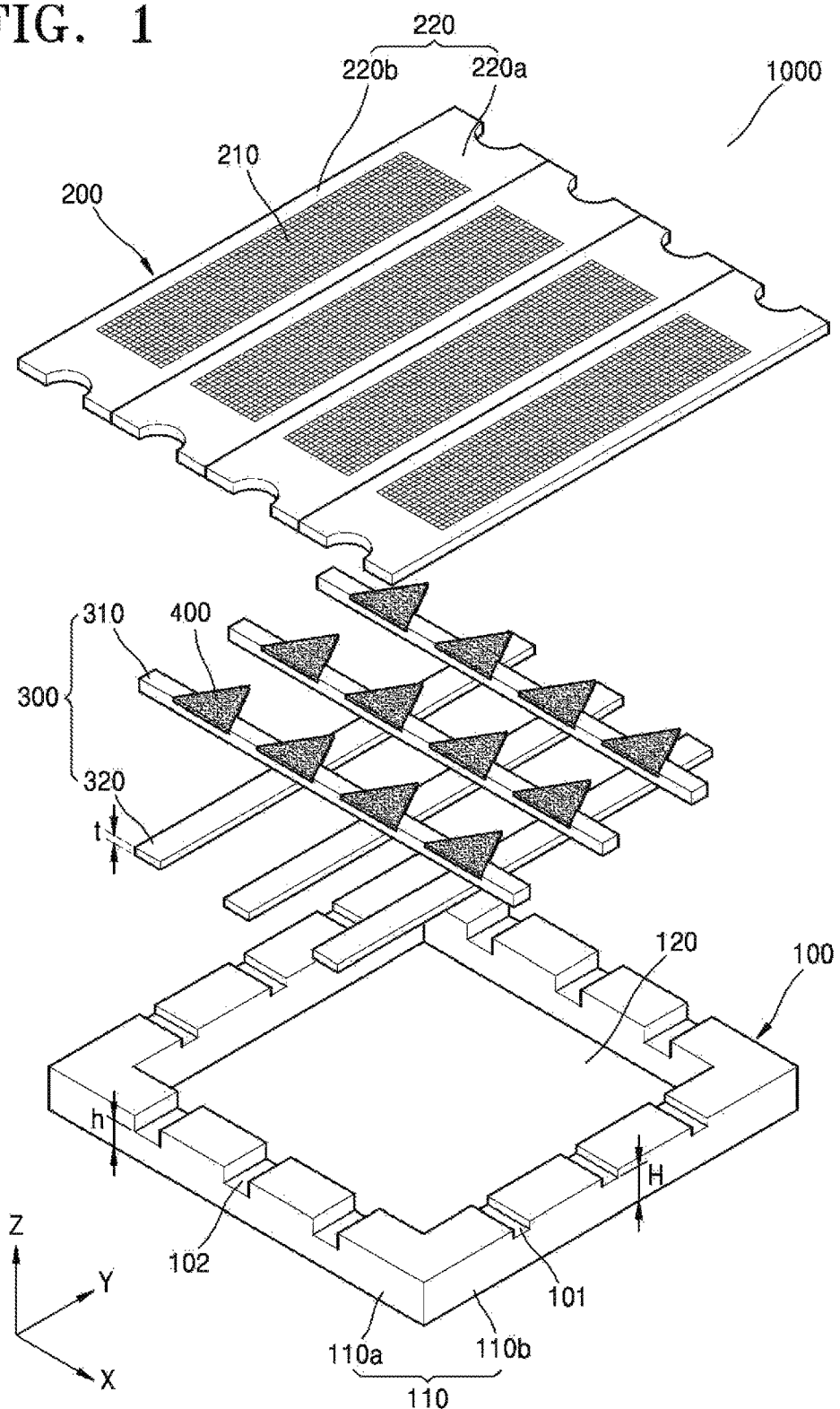
FIG. 1 is an exploded perspective view schematically illustrating an exemplary embodiment of a mask frame assembly according to the invention.

As the invention allows for various changes and numerous embodiments, particular exemplary embodiments will be illustrated in the drawings and described in detail in the written description. However, this is not intended to limit the invention to particular modes of practice, and it is to be appreciated that all changes, equivalents, and substitutes that do not depart from the spirit and technical scope of the invention are encompassed in the invention In the description of the invention, certain detailed explanations of the related art are omitted when it is deemed that they may unnecessarily obscure the essence of the invention.

It will be understood that when an element is referred to as being "on" another element, it can be directly on the other element or intervening elements may be present therebetween. In contrast, when an element is referred to as being "directly on" another element, there are no intervening elements present.

While such terms as "first," "second," etc., may be used to describe various components, such components must not be limited to the above terms. The above terms are used only to distinguish one component from another.

The x-axis, the y-axis, and the z-axis used herein are not limited to three axes of the rectangular coordinate system, and may be interpreted in a broader sense. For example, the x-axis, the y-axis, and the z-axis may be perpendicular to one another, or may represent different directions that are not perpendicular to one another.

Reference will now be made in detail to exemplary embodiments, which are illustrated in the accompanying drawings, where like reference numerals refer to like elements throughout. In this regard, the exemplary embodiments may have different forms and should not be construed as being limited to the descriptions set forth herein. Accordingly, the exemplary embodiments are merely described below, by referring to the figures, to explain features of the present description. Thicknesses of layers and regions in the drawings are enlarged for clarity. In addition, in the drawings, thicknesses of some layers and regions are exaggerated for convenience of description.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

In general, when display apparatuses including organic light-emitting display apparatuses are manufactured, various layers are formed by a method such as deposition. For example, during a process of manufacturing an organic light-emitting display apparatus, a hole injection layer, a hole transport layer, an emission layer, an electron transport layer, an electron injection layer, or the like is formed on a substrate in an active or display region thereof, by a deposition apparatus. During this process, a material is deposited on the substrate at a predetermined portion of the substrate by using a mask. The mask includes a pattern which corresponds to the location and/or pattern or shape of the layer being formed on the substrate. The material is deposited on the substrate through the pattern of the mask to form the layer at a predetermined location of the substrate and/or having a predetermined pattern or shape on the substrate.

However, when using a conventional mask frame assembly and method of manufacturing a display apparatus, there is a limitation in the complexity of patterns that can be formed in the mask and/or by the mask.

Figure 2:
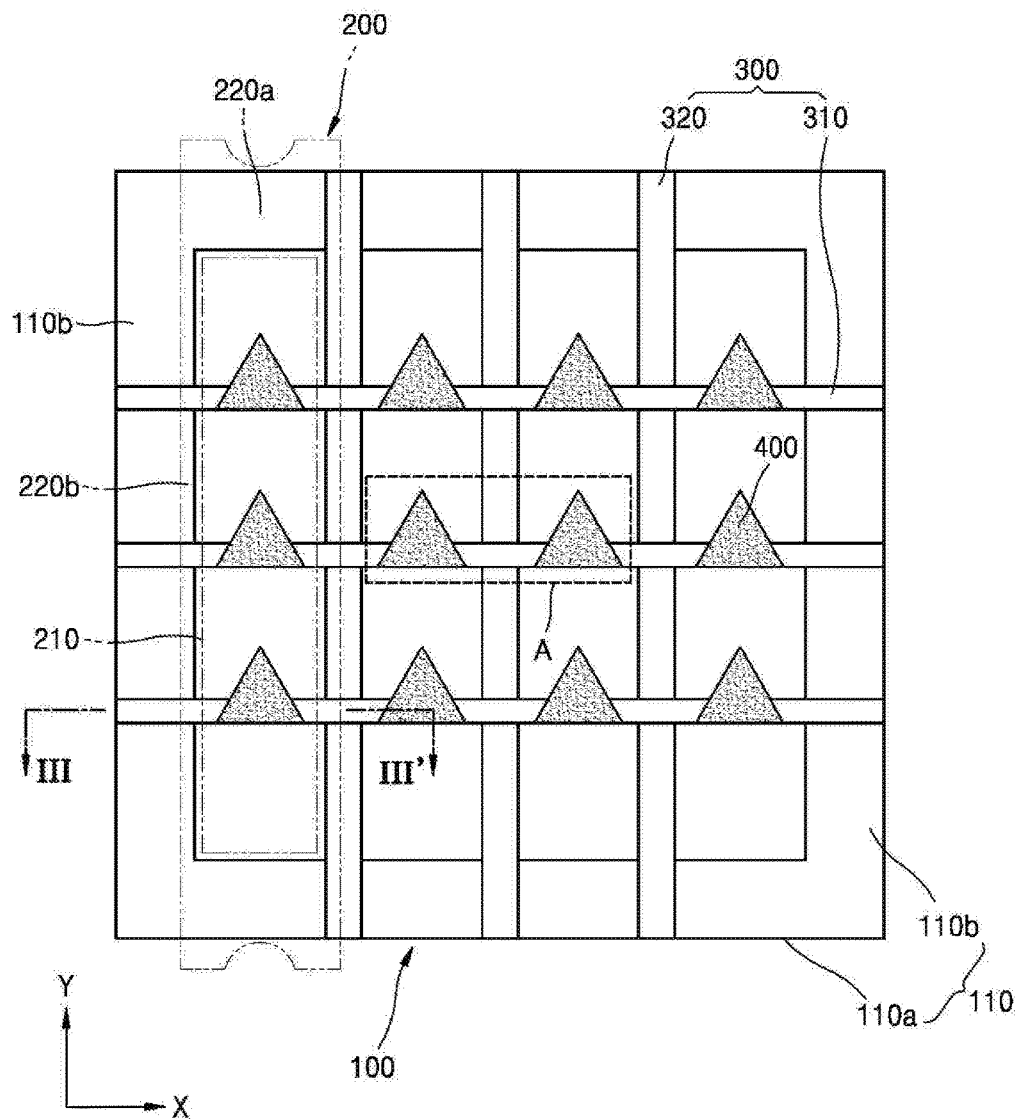
FIG. 2 is a top view of an exemplary embodiment of the mask frame assembly of FIG. 1.

FIG. 1 is an exploded perspective view schematically illustrating an exemplary embodiment of a mask frame assembly 1000 according to the invention. FIG. 2 is a top plan view of the mask frame assembly 1000 of FIG. 1. The mask frame assembly 1000 in FIG. 2 is shown in an assembled state thereof, as compared to the unassembled state in FIG. 1.

Referring to FIGS. 1 and 2, the mask frame assembly 1000 includes a frame 100, a supporting member 300 and a mask stick 200. A magnet 400 is coupled to at least a portion of the supporting member 300. The magnet 400 may be provided in plural.

The frame 100 includes an opening 120 and a frame member 110 which surrounds the opening 120. The frame member 110 may define the opening 120 of the frame 100. In this regard, the opening 120 may be substantially quadrangular, and overall the frame 100 may also be quadrangular. The frame 100 may include two first frame members 110b facing each other with respect to the opening 120 and two second frame members 110a facing each other with respect to the opening 120. Each first frame member 110b may define a length thereof extended in the direction Y and each second frame member 110a may define a length thereof extended in the direction X. A width of a respective frame member, which is smaller than the length thereof, may be defined perpendicular to the length thereof. In the top plan view, the length of a frame member may be a maximum dimension among dimensions thereof extending in the direction X and the direction Y.

The mask stick 200 and the supporting member 300 may be coupled to the frame 100. The frame 100 may include a relatively highly rigid metal material so that the frame 100 may not be significantly deformed when the mask stick 200 and the supporting member 300 are coupled thereto. The mask stick 200 may be provided in plural within the mask frame assembly 1000.

The supporting member 300 is coupled to the frame 100. The supporting member 300 includes a (first) support 310. The support 310 may be provided in plural within the supporting member 300. The support 310 defines a length thereof which extends in a first direction (direction +X, for example, in the direction of the X arrow in FIG. 1) across the opening 120 of the frame 100. In the top plan view, the length of the support 310 may be a maximum dimension among dimensions thereof extending in the direction +X and the direction +Y.

The support 310 has an end in a direction −X (for example, in an opposite direction to the X arrow in FIG. 1) and another (opposing) end in the direction +X, each end coupled to the frame 100. In this regard, the first direction (direction +X) corresponds to a length direction of the support 310. The support 310 may reduce or effectively prevent deformation of the mask stick 200 coupled to the frame 100. The support 310 may define or correspond to a region of the mask stick 200 that allows a deposition material to pass therethrough and a region of the mask stick 200 that blocks the deposition material from passing therethrough.

The supporting member 300 may further include an additional (second) support 320, in addition to the support 310. The additional support 320 extends across the opening 120 of the frame 100 similar to the support 310 extending across the opening 120 of the frame 100. The additional support 320 extends in a second direction (direction +Y, for example, in the direction of the Y arrow in FIG. 1) to cross the support 310. The additional support 320 has an end in a direction −Y (for example, in an opposite direction to the Y arrow in FIG. 1) and another (opposing) end in the direction +Y, each end coupled to the frame 100. In this regard, the second direction (direction +Y) corresponds to a length direction of the additional support 320, which is a direction crossing the length direction of the support 310, and may be the same as a width direction of the support 310. The additional support 320 may contact the support 310 and reduce or effectively prevent deformation of the support 310 and the mask stick 200 coupled to the frame 100. The additional support may block a deposition material from passing through a gap between edges of adjacent mask sticks 200.

There are various ways of coupling the supporting member 300 to the frame 100. In an exemplary embodiment, for example, by forming supporting grooves 101 and 102 in the frame 100, both of opposing end portions of the supporting member 300 may be inserted into the supporting grooves 101 and 102.

As an example, the two first frame members 110b of the frame 100 facing each other may each have a first supporting groove 101 provided in plural, and the two second frame members 110a facing each other may each have a second supporting groove 102 provided in plural. The end of the support 310 in the direction −X and the other (opposing) end of the support 310 in the direction +X are respectively inserted into the first supporting grooves 101 respectively disposed in the two first frame members 110b facing each other. Likewise, the end of the additional support 320 in the direction−Y and the other (opposing) end of the additional support 320 in the direction +Y are respectively inserted into the second supporting grooves 102 respectively disposed in the two second frame members 110a facing each other.

A top surface of the frame 100 faces the mask stick 200. The first supporting groove 101 and the second supporting groove 102 are defined recessed from the top surface of the frame 100 by a predetermined depth. Where the opposing ends of the support 310 are respectively disposed in opposing first supporting grooves 101, and where the opposing ends of the additional support 320 are respectively disposed in opposing second supporting grooves 102, a top surface of the supporting member 300 is defined by a top surface of the support 310. Since both the support 310 and the additional support 320 are disposed in the recessed first and second supporting grooves 101 and 102, the top surface of the support 310 is effectively coplanar with the top surface of the frame 100. Thus, the top surface of the support 310 may be at the same height as that of the top surface of the frame 100. In this respect, the support 310 may not protrude outward from the frame 100 in a thickness direction of the frame 100.

Also, in the thickness direction of the frame 100, the support 310 may be disposed on (e.g., above) the additional frame 320. In this regard, it is desired to avoid protrusion outward or detachment of the support 310 due to the additional support 320 located under the support 310. Accordingly, a depth of the first supporting grooves 101 into which opposing end portions of the support 310 are inserted may be less than that of the second supporting grooves 102 into which opposing end portions of the additional support 320 are inserted.

For strong coupling of the support 310 and the additional support 320 to the frame 100, a depth of the first supporting grooves 101 in a direction toward the bottom surface of the frame 100 from the top surface of the frame 100, that is, in direction −Z (for example, in an opposite direction to the Z arrow in FIG. 1), may be the same as an overall or maximum thickness of the support 310. Similarly, a depth of the second supporting grooves 102 in the direction −Z may be the same as a value obtained by adding a thickness 't' (e.g., overall or maximum thickness) of the additional support 320 to the overall or maximum thickness of the support 310. By coupling the support 310 and the additional support 320 to the frame 100 having such first supporting grooves 101 and second supporting grooves 102, the support 310 and the additional support 320 may be fixed to the frame 100 and thus undesirable movement of the support 310 and the additional support 320 relatively to the frame 100 may be reduced or effectively prevented.

However, a method of coupling the supporting member 300 to the frame 100 is not necessarily limited to the above example, and various methods may be used. In an exemplary embodiment, for example, opposing end portions of the supporting member 300 may be fastened to respective members of the frame 100 by a fastening member such as pins, screws, etc. In another exemplary embodiment, supports of the supporting member 300 may be stretched and opposing ends of the stretched supporting member 300 may be welded to the frame 100.

Also, although not illustrated in FIG. 1, etc., in order to firmly couple the support 310 and the additional support 320 to each other, at an intersection of the support 310 and the additional support 320, a concave portion may be formed in one of the support 310 and the additional support 320, the concave portion recessed away from the other of the support 310 and the additional support 320, Thus, the other of the support 310 and the additional support 320, which does not have the concave portion, may be inserted into the concave portion of the one of the support 310 and the additional support 320. As another example, at an intersection of the support 310 and the additional support 320, the support 310 and the additional support 320 may be fastened to each other by a fastening member such as a pin, a screw, etc. or may be welded to each other.

The support 310 and the additional support 320 may be provided in plural. Although FIGS. 1 and 2 illustrate three supports 310 and three additional supports 320 on the frame 100, the support 310 and the additional support 320 may number less than 3 or more than 3.

The mask stick 200 is disposed on the supporting member 300. A length of the mask stick 200 extends in the second direction (direction +Y) across the first direction (direction +X) that is the length direction of the support 310. In the top plan view, the length of the mask stick 200 may be a maximum dimension among dimensions thereof extending in the direction +X and the direction +Y. The mask stick 200 has an end in the direction −Y and another (opposing) end in the direction +Y, each coupled to a different second frame member of the two second frame members 110a of the frame 100 which face each other. That is, the length direction of the mask stick 200 may be the same as the length direction of the additional support 320. In this regard, by applying a tensile force to both of opposing end portions of the mask stick 200 in the second direction (direction +Y) that is the length direction of the mask stick 200, and thus coupling each of the end portions of the mask stick 200 to the frame 100 with the additional support 320 thereunder, sagging of a central portion of the mask stick 200 in roughly the direction −Z due to gravity, etc. after the coupling may be reduced. Also, the mask stick 200 may be provided in plurality across the frame 100. When such a split stick-type mask including the plurality of mask sticks 200 corresponding to the entire opening 120 is used, sagging due to self-weight of the split stick-type mask may be reduced because a load of an individual mask stick 200 is relatively small compared with when one large single individual mask corresponding to the entire opening 120 of the frame 100 is used.

The mask stick 200 includes or defines a deposition region 210 located at the central portion of the mask stick 200, and a masking portion 220 surrounding the deposition region 210. The deposition region 210 is a portion of the mask stick 200 that allows a deposition material to pass therethrough, and the masking portion 220 is a portion of the mask stick 200 that blocks the deposition material from passing therethrough.

A length of the deposition region 210 may extend in the second direction (direction +Y) that is the length direction of the mask stick 200, and a width of the deposition region 210 which is smaller than the length thereof extends in the first direction (direction +X). In the top plan view, the length of the deposition region 210 may be a maximum dimension among dimensions thereof extending in the direction +X and the direction +Y.

That is, in the mask stick 200, the entire region except the masking portion 220 located at an edge of the mask stick 200 may be the deposition region 210.

The deposition region 210 of the mask stick 200 may be an integral opening portion which excludes a conventional rib portion of a conventional mask stick. The integral opening portion may be defined by deposition openings consecutively disposed across an entire of the deposition region 210, in both the length and width direction of the deposition region 210. The deposition region 210 is disposed common to each display region among plural display regions of the substrate, even though the display regions are spaced apart from each other in the length direction of the substrate by non-display regions thereof. A deposition opening may extend through an entire thickness of the mask stick 200 to allow the deposition material to pass therethrough. Portions of the mask stick 200 between the deposition openings of the deposition region 210 and forming the deposition openings, along with the deposition openings formed thereby, may form a mesh-like structure. In the mask stick 200, the entire region except for the deposition region 210 may be the masking portion 220 having a solid structure (e.g., no openings or mesh-like structure therein). For an entire overall length of the deposition region 210, no solid structure of the mask stick 200 is disposed in the deposition region 210. That is, even the non-display region of the substrate is overlapped by the deposition region 210 of the mask stick 200.

When a mask stick 200 having such the integral opening portion is used, adhesion between the mask stick and a substrate to which the deposition material is deposited at a display region of the substrate, may be stronger as compared with when a conventional mask stick is used that has a rib defining individual display regions of the substrate disposed in the middle of the deposition region 210. That is, by removing the rib of the conventional mask stick, a problem that may arise where the conventional mask stick is partially detached due to a repulsive force between a magnet below the mask stick and the rib of the conventional mask stick may be fundamentally resolved.

The deposition region 210 corresponds to a plurality of display regions of the substrate to which the deposition material is deposited and which are disposed in the second direction (direction +Y) of the substrate. A non-display region of the substrate is an area of the substrate to which the deposition material should not be deposited. In this regard, with the integral opening portion of the deposition region 210 having deposition openings consecutively disposed across an entire of the deposition region 210, in order to differentiate each of the plurality of display regions of the substrate in the deposition region 210, as described above, the support 310 extending in the first direction (direction +X) is disposed under the mask stick 200 to contact or be adjacent to the deposition region 210 of the mask stick 200 in the in the direction −Z . That is, the support 310 of the supporting member 310 may serve as the above-described rib of the conventional mask stick, and blocks the deposition material from passing through the mask stick 200 to the substrate at a non-display region of the substrate (e.g., between display regions of the substrate adjacent to each other in the second direction (direction +Y) of the substrate). The display regions may also be adjacent to each other in the first direction (direction +X)

The masking portion 220 may collectively include two first masking portions 220a facing each other with respect to the deposition region 210 and two second masking portions 220b facing each other with respect to the deposition region 210.

For a same one mask stick 200, the first masking portions 220a are disposed on (e.g., overlapping) the two second frame members 110a of the frame 100 which face each other. For the same one mask stick 200, the second masking portions 220b are disposed on (e.g., overlapping) the two first frame members 110b of the frame 100 which face each other and an additional support 320. The first masking portions 220a of the same one mask stick 200 correspond to the end of the mask stick 200 in the direction −Y and the other (opposing) end of the mask stick 200 in the direction +Y, and are respectively coupled to a different second frame member of the second frame members 110a of the frame 100. Although there are various ways of coupling the first masking portions 220a and the second frame members 110a to each other, by taking into account a shape of the mask stick 200, for example, the first masking portions 220a and the second frame members 110a may be welded to each other, or may be fastened to each other by pins, screws, etc.

For a same one mask stick 200 disposed at one of the first frame members 110b, the second masking portions 220b are disposed on (e.g., overlapping) one additional support 320 and the one of the first frame members 110b. For a same one mask stick 200 disposed non-overlapping one of the first frame members 110b, the second masking portions 220b are disposed on (e.g., overlapping) two additional supports 320 adjacent to each other along the direction X.

The mask stick 200 may be a split-type stick in the form of a thin film. In an exemplary embodiment, for example, the mask stick 200 in the thin film form may be a fine metal mask ("FMM") formed of a metal thin film and may include a ferromagnetic material. In an exemplary embodiment, the material of the mask stick 200 may be a material selected from steel use stainless ("SUS"), Invar, nickel, cobalt and an alloy thereof. The deposition region 210 of the mask stick 200 may include a plurality of openings and/or a plurality of slits.

A magnet 400 is coupled to the support 310 so that the mask stick 200 including a ferromagnetic material as described above may be firmly adhered to the support 310. In this regard, the magnet 400 may be disposed between the mask stick 200 and the support 310. A top surface of the magnet 400 may be at the same height as that of a top surface of the support 310, that is, coplanar with the top surface of the support 310. Thus, since the top surfaces of the magnet 400 and the support 310 are coplanar with each other, the entire top surface of the support 310 excluding the magnet 400 may contact the mask stick 200 due to a magnetic force, etc. between the magnet 400 and the mask stick 200.

In addition, a planar area of the magnet 400 overlaps a planar area of the support 310 and extends further than the support 310 in the top plan view. The magnet 400 may be disposed between the deposition region 210 of the mask stick 200 and the support 310. Similar to how the support 310 is described as blocking the deposition material from passing through the mask stick 200 to the substrate at a non-display region of the substrate, the magnet 400 overlapping at least a portion of the deposition region 210 thus blocks the deposition material travelling from a portion of the deposition region 210 that overlaps the magnet 400, to the substrate. That is, the magnet 400 serves as a kind of masking portion.

A collective masking portion of the mask frame assembly 1000 may be cooperatively formed by a planar area of the masking portion 220 of the mask stick 200, a planar area of the support 310 and a planar area of the magnet 400. The portion of the deposition region 210 not overlapped (e.g., exposed) from the magnet 400, the support 310 and the masking portion 220 of the mask stick 200 may define a deposition pattern of the mask stick 200. The deposition pattern may correspond to the planar profile or shape of a layer to be formed on the substrate, such as in the display region of the substrate. A remaining planar area of the deposition region 210 except for the planar areas overlapped by the masking portion 220 of the mask stick 200, the support 310 and the magnet 400 define the (complex) deposition pattern. When the magnet 400 is manufactured to have various shapes in the top plan view, a relatively complex deposition pattern defined by the collective masking portion of the mask frame assembly 1000 may be easily formed.

Particularly, when the mask stick 200 takes the form of a thin film, there may be considerable difficulty in forming a masking portion having a relatively complex shape by portions of the mask stick 200 itself, to correspondingly define a relatively complex deposition pattern. However, by coupling the magnet 400 having an atypical shape instead of a quadrangular shape to the support 310, and aligning and coupling the mask stick 200 including a ferromagnetic material on the atypically-shaped magnet 400, a relatively high-resolution deposition pattern corresponding to a region of the deposition region 210 that is not blocked by the magnet 400 and the support 310 in cooperation with the masking portion 220 may be formed.

Although FIGS. 1 and 2 illustrate the magnet 400 disposed or formed on the support 310 only, a magnet 400 of an atypical shape that overlaps the deposition region 210 may instead be coupled to the additional support 320 only or may be coupled to both the additional support 320 as well as the support 310. Thus, by varying a coupling structure of the magnet 400 to various elements of the mask frame assembly 1000, a more complex deposition pattern may be formed. Although there are various ways of coupling the magnet 400 to the support 310, detailed descriptions thereof will be made later with reference to FIGS. 4A to 5B.

Figure 3:
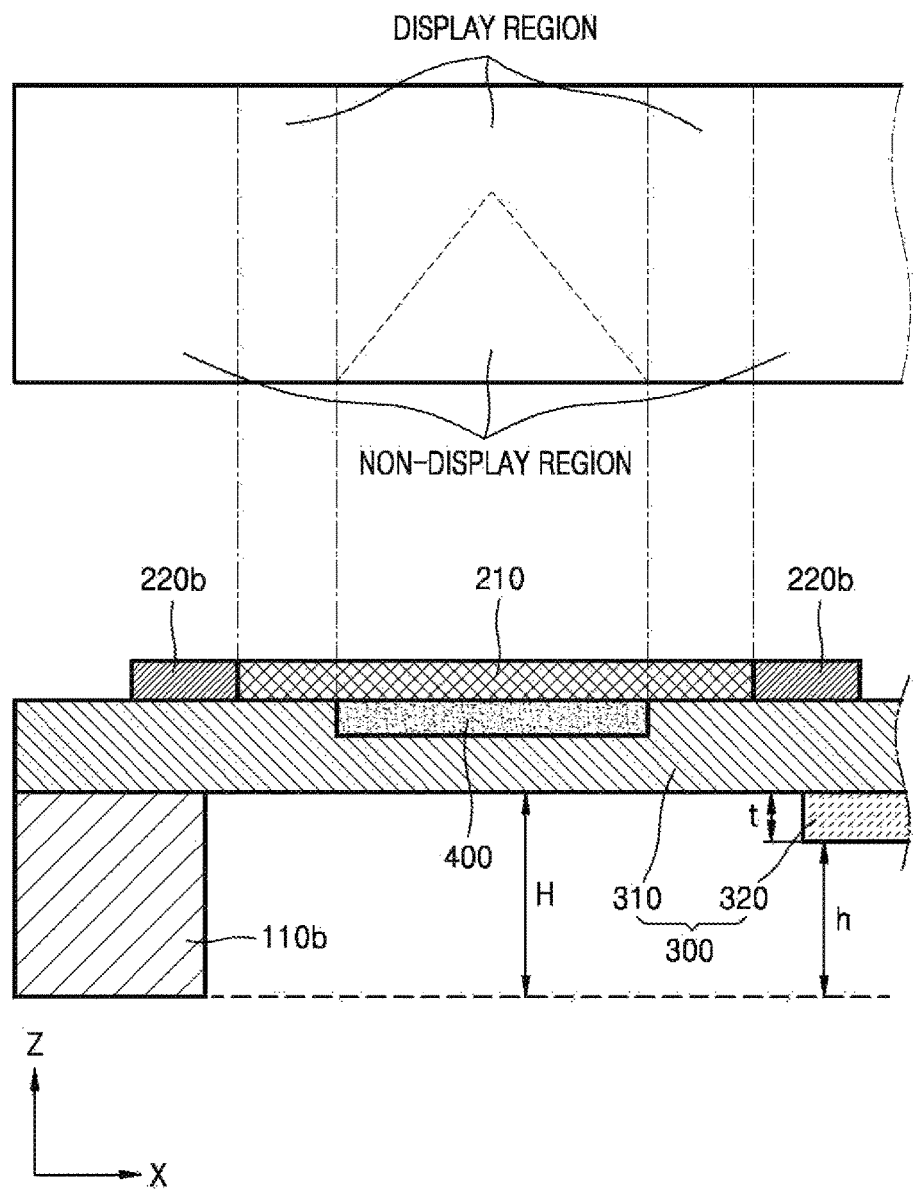
FIG. 3 is a cross-sectional view taking along line III-III' of FIG. 2.

FIG. 3 is a cross-sectional view taking along line III-III' of FIG. 2.

As described above, when a mask stick 200 having the integral opening portion is used, adhesion between the mask stick 200 and a substrate to which the deposition material is deposited at a display region of the substrate, may be stronger as compared with when a conventional mask stick is used that has a rib defining individual display regions of the substrate disposed in the middle of the deposition region 210. Referring to the features of the mask frame assembly 1000 shown in FIG. 3, a substrate would be disposed adjacent to the mask stick 200, such as in contact with the mask stick 200 to be adhered thereto.

Referring to FIG. 3, in a cross-section taken along line III-III' of FIG. 2, the support 310 is disposed on a first frame member 110b of the frame 100, and the mask stick 200 is disposed on the support 310. Also, a magnet groove or magnet slot is disposed or formed at a surface of the support 310 which contacts the deposition region 210 of the mask stick 200, and the magnet 400 is inserted in the magnet groove or magnet slot. Although FIG. 3 illustrates a groove which does not extend through an entire thickness of the support 310 in the direction −Z at a location directly under the magnet 400, the support 310 may include a slot which extends through the entire thickness thereof, instead of such a groove.

Referring to FIGS. 2 and 3, the additional support 320 may be disposed below and overlapping a second masking portion 220b as the edge of the mask stick 200. A plane of a bottom surface of the frame 100 is indicated as a dotted line in FIG. 3. As described above, the top surface of the frame 100 is disposed coplanar with the top surface of the support 310. A total thickness of the frame may be taken from the bottom surface to the top surface thereof, and such total thickness may exist for each of the first and second frame members 110b and 110a of the frame.

As shown in FIGS. 1 and 3, a height h of the frame 100 is a height from the bottom surface of the frame 100 to the bottom surface of the additional support 320, and a height H of the frame 100 is a height from the bottom surface of the frame 100 to the bottom surface of the support 310. The heights h and H may also be considered from the bottom surface (or plane thereof) of the frame 100 to a bottom of a respective groove (101 or 102). The height H may be equal to the sum of the height h and a thickness t which is a thickness of the additional support 320. The thickness may be a maximum thickness of the additional support 320. As shown in FIG. 1, the second supporting grooves 102 of the frame 100 in which the additional support 320 is inserted has a depth greater by the thickness t of the additional support 320 than that of the first supporting grooves 101 of the frame 100 in which the support 310 is inserted.

As described above, in order to reduce or effectively prevent the occurrence of detachment or a shadow error between the support 310 and the mask stick 200 and/or between the magnet 400 and the mask stick 200, a total planar area of a surface of the support 310 and the magnet 400 which contacts the mask stick 200 is maximized as much as possible, and a total planar area of the bottom surface of the mask stick 200 which contacts the support 310 and the magnet 400 while in a planar arrangement is also maximized as much as possible. Accordingly, a surface of the support 310 facing the mask stick 200 and a surface of the magnet 400 facing the mask stick 200 may be located in the same plane (e.g., coplanar) to form a high-resolution deposition pattern. That is, the top surfaces of the support 310 and the magnet 400 may be located in the same plane, and the bottom surface of the mask stick 200 may be seated on the same plane while in a roughly planar (e.g., parallel) arrangement with the top surfaces.

Also, in order to reduce or effectively prevent the occurrence of deformation of the mask stick 200, such as sagging of the mask stick 200, a total planar area of the bottom surface of the mask stick 200 which contacts the support 310, the magnet 400 and the frame 100 while in a planar arrangement is maximized as much as possible. Accordingly, the surface of the support 310 facing the mask stick 200, the surface of the magnet 400 facing the mask stick 200, and a surface of the frame 100 facing the mask stick 200 may be located in the same plane (e.g., coplanar). That is, the top surfaces of the support 310, the mask 400 and the frame 100 may be located in the same plane, and the bottom surface of the mask stick 200 may be seated on the same plane while in a roughly planar (e.g., parallel) arrangement with the top surfaces.

Figure 4A:
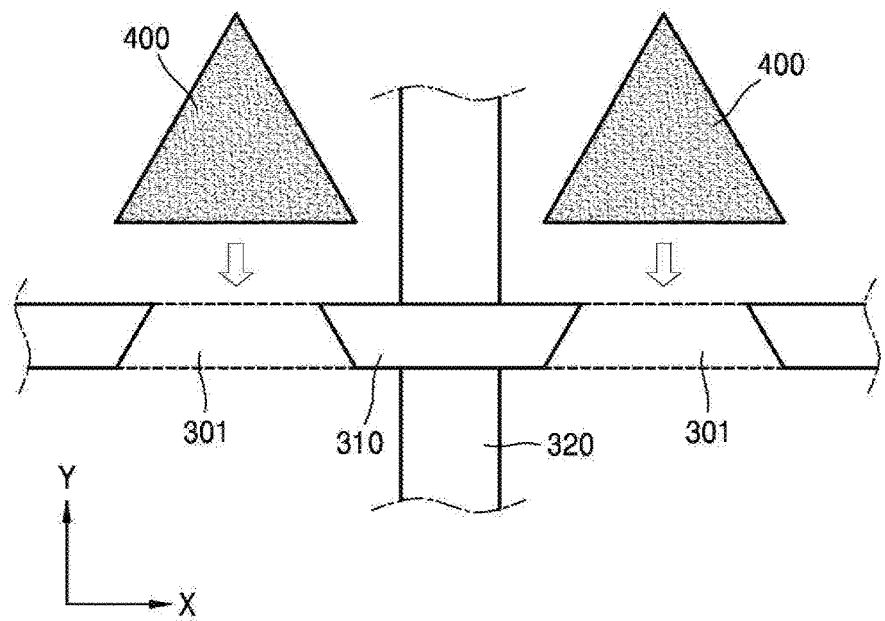
FIGS. 4A and 4B are respectively an enlarged exploded top plan view of an exemplary embodiment of portion A of FIG. 2 and an enlarged assembled top plan view thereof.
Figure 4B:
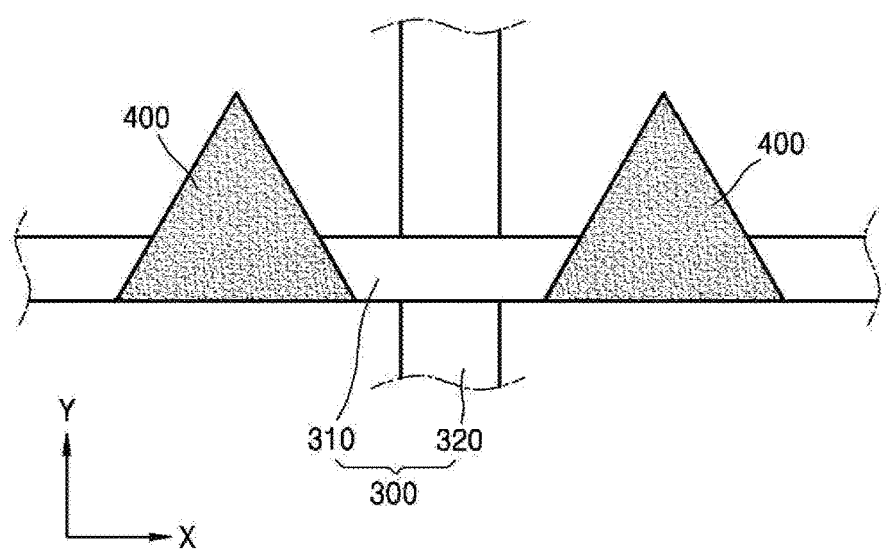

FIGS. 4A and 4B are respectively an enlarged exploded top plan view of an exemplary embodiment of portion A of FIG. 2 and an enlarged assembled top plan view thereof.

Referring to FIGS. 4A and 4B, the support 310 has a magnet groove or magnet slot 301 disposed or formed at the top surface of the support 310. The magnet groove or magnet slot 301 is extended from the top surface of the support 310. Likewise, by disposing or forming the magnet groove or magnet slot 301 at the top surface of the support 310 and disposing the magnet 400 in the magnet groove or magnet slot 301, as described above, the top surface of the support 310 and the top surface of the magnet 400 may be located in the same plane (e.g., coplanar).

In this regard, a planar shape of the magnet groove or magnet slot 301 in the top plan view corresponds to that of a portion of the magnet 400 which is coupled to and disposed overlapping the support 310. In an exemplary embodiment of manufacturing the mask frame assembly 1000, the magnet groove or magnet slot 301 may be disposed or formed in a thickness direction of the support 310 (direction −Z of FIG. 1) from the top surface of the support 310 such as by laser processing, etching, etc.

Since the magnet groove or magnet slot 301 extends through an entire width of the support 310, at least a portion of the magnet 400 may be coupled to the support 310 while overlapping the entire width of the support 310. In this regard, the entire width of the support 310 refers to a distance between opposing edges of the support 310 facing each other in the second direction +Y and extending in the first direction (direction +X). Since the magnet 400 extends further in the second direction +Y than an edge of the support 310, at least a portion of the magnet 400 overlaps the deposition region 210 of the mask stick 200. Also, the opposing edges of the support 310 facing each other in the second direction +Y and extending in the first direction (direction +X) may be otherwise referred to as an edge in the direction +Y and an edge in the direction −Y, and the same applies to exemplary embodiments that will be described later and modifications thereof.

Although FIGS. 4A and 4B illustrate that an edge of the magnet 400 in the direction −Y and an edge of the support 310 in the direction −Y are aligned, the magnet 400 may be coupled to the support 310 so that the entire width of the support 310 may be disposed at a central portion of the magnet taken in the direction Y to overlap the central portion of the magnet 400. That is, edges of the support 310 may not be aligned with an edge of the magnet 400. In this case, the magnet 400 serves as a masking portion for two adjacent deposition regions 210 respectively disposed at opposite sides of the support 310 in the direction Y.

Figure 5A:
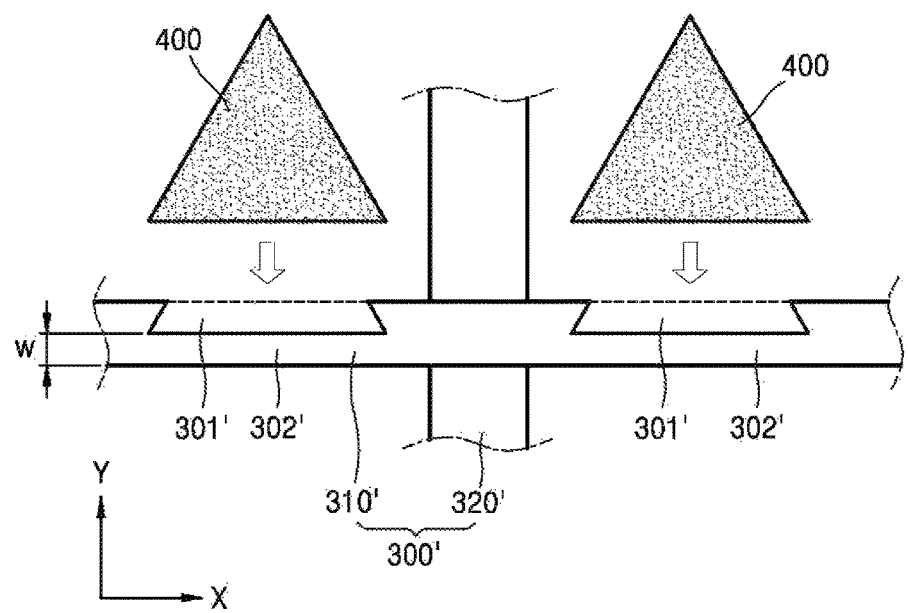
FIGS. 5A and 5B are respectively an enlarged exploded top plan view of another exemplary embodiment of a portion of a mask frame assembly and an enlarged assembled top plan view thereof.
Figure 5B:
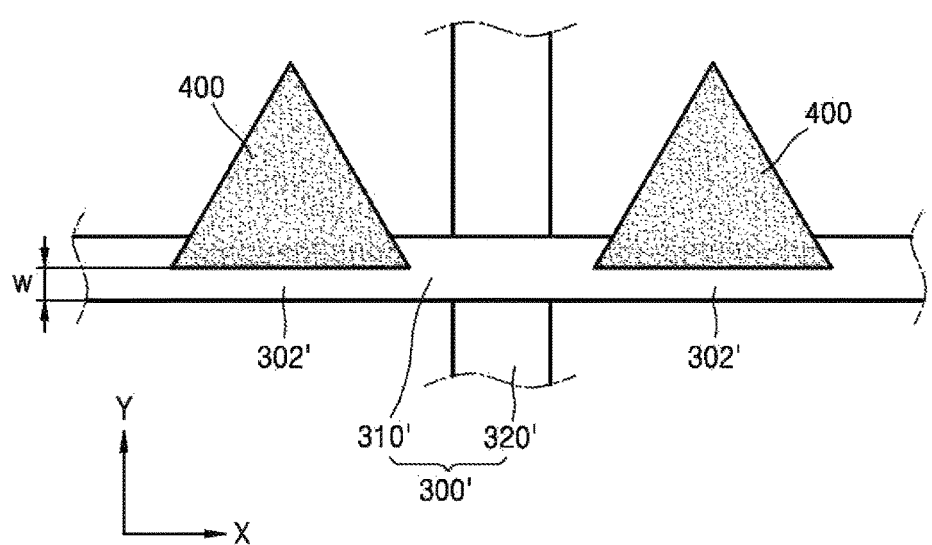

FIGS. 5A and 5B are respectively an enlarged exploded top plan view of another exemplary embodiment of a portion of a mask frame assembly and an enlarged assembled top plan view thereof. The portion of the mask frame assembly in FIGS. 5A and 5B may correspond to the portion A of FIG. 2.

Referring to FIGS. 5A and 5B, a supporting member 300' includes a support 310' and an additional support 320' crossing each other. The support 310' has a magnet groove or magnet slot 301' disposed or formed at the top surface of the support 310'. Likewise, by disposing or forming the magnet groove or magnet slot 301' at the top surface of the support 310' and disposing the magnet 400 in the magnet groove or magnet slot 301', as described above, the top surface of the support 310' and the top surface of the magnet 400 may be located in the same plane (e.g., coplanar).

A planar shape of the magnet groove or magnet slot 301' corresponds to that of a portion of the magnet 400 which is coupled to the support 310'. In an exemplary embodiment of manufacturing the mask frame assembly 1000, the magnet groove or magnet slot 301' may be formed by laser processing, etching, etc. In this regard, the magnet groove or magnet slot 301' may be disposed or formed to have the shape of a groove or slot in a thickness direction of the support 310' (direction −Z of FIG. 1) from the top surface of the support 310' and have the shape of a groove in a width direction of the support 310' (direction −Y) from an edge of the support 310' in the direction +Y. Thus, a blocking portion 302' having a width w remains at an edge of the support 310' in the direction −Y.

Since the magnet groove or magnet slot 301' extends only partially through the width of the support 310', at least a portion of the magnet 400 may be disposed in the groove extended in the width direction of the support 310' (direction −Y) at the edge of the support 310' in the direction +Y, and thus may be coupled to the support 310'. In this regard, at least a portion of the magnet 400 overlaps the deposition region 210 of the mask stick 200 outside of the support 310'.

The support 310' may have the blocking portion 302', and the blocking portion 302' may be located at an edge extending in a length direction of the support 310' (direction +X). As illustrated in FIGS. 5A and 5B, for example, the blocking portion 302' may be located at the edge of the support 310' in the direction −Y. The blocking portion 302' may restrict movement of the magnet 400 in the width direction of the support 310' (direction −Y).

Although exemplary embodiments of a mask frame assembly have been described thus far, the present disclosure is not limited thereto. That is, a display apparatus manufacturing method for manufacturing a display apparatus by using such a mask frame assembly, or a display apparatus manufactured by the method are also included in the scope of the invention.

In an exemplary embodiment, a display apparatus manufacturing method according to the invention includes preparing a substrate on which a layer of the display apparatus is formed in a display region of the substrate, and depositing a deposition material at a plurality of display regions of the substrate by using a mask frame assembly according to one of the above-described exemplary embodiments and modifications thereof. The plurality of display regions of the substrate may correspond to pixels within a single display apparatus or may correspond to a plurality of display apparatuses. The display regions of the substrate may be separated from each other by non-display regions.

In an exemplary embodiment, the deposition materials may be simultaneously deposited at each of the plurality of display regions of the substrate by using a mask frame assembly according to one of the above-described exemplary embodiments and modifications thereof. Thus, one or more exemplary embodiment of the mask frame assembly may be used to simultaneously form a plurality of pixels and/or a plurality of display apparatuses. In an exemplary embodiment of manufacturing an organic light-emitting display apparatus, simultaneously depositing deposition materials may include, for example, forming a hole injection layer, a hole transport layer, an emission layer, an electron transport layer, an electron injection layer, or the like, but the invention is not limited thereto.

As described above, according to the above-described exemplary embodiments, a mask frame assembly in which a relatively complex pattern may be formed having a relatively high resolution, and a method of manufacturing a display apparatus using the mask frame assembly may be implemented. The scopes of the exemplary embodiments are not limited to the above effects.

It should be understood that exemplary embodiments described herein should be considered in a descriptive sense only and not for purposes of limitation. Descriptions of features within each exemplary embodiment should typically be considered as available for other similar features in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A mask frame assembly for deposition, comprising:
a frame comprising an opening portion;
a first support extending in a first direction across the opening portion, and comprising opposing ends in the first direction which are each coupled to the frame;
a mask stick through which a deposition material is passable to a plurality of display regions of a substrate, the mask stick disposed on the first support and extending in a second direction crossing the first direction, the mask stick comprising:
opposing ends in the second direction which are each coupled to the frame, and
a deposition region at which the deposition material is passable to the substrate, a same one of the deposition region disposed common to each of the plurality of display regions of the substrate; and
a magnet coupled to the first support and overlapping the deposition region of the mask stick, wherein
the deposition region includes a plurality of deposition openings, and
a portion of the plurality of deposition openings is masked by the magnet.

2. The mask frame assembly of claim 1, wherein the magnet is between the same one of the deposition region of the mask stick and the first support.

3. The mask frame assembly of claim 1, wherein
a surface of the first support facing the same one of the deposition region of the mask stick comprises a magnet groove or magnet slot, and
the magnet is disposed in the magnet groove or magnet slot.

4. The mask frame assembly of claim 3, wherein the surface of the first support facing the same one of the deposition region of the mask stick and a surface of the magnet facing the mask stick are coplanar with each other.

5. The mask frame assembly of claim 1, wherein
a width of the first support is defined in the second direction,
a surface of the first support facing the same one of the deposition region of the mask stick includes a magnet groove or magnet slot extended across a portion of the width of the first support, and a remaining portion of the width of the first support defines a blocking portion of the first support,
the magnet is disposed in the magnet groove or magnet slot extended across the portion of the width of the first support, and
an edge of the blocking portion is aligned with an edge of the first support which extends in the first direction, the blocking portion of the first support restricting movement in the second direction of the magnet disposed in the magnet groove or magnet slot.

6. The mask frame assembly of claim 1, wherein a surface of the first support facing the same one of the deposition region of the mask stick, a surface of the magnet facing the same one of the deposition region of the mask stick, and a surface of the frame facing the mask stick are coplanar with each other.

7. The mask frame assembly of claim 1, further comprising a second support below the mask stick,
the second support extending in the second direction, crossing the first support and comprising opposing ends in the second direction which are each coupled to the frame.

8. The mask frame assembly of claim 7, wherein the second support is between the first support and the frame.

9. The mask frame assembly of claim 7, wherein
the frame comprises first supporting grooves opposing each other in the first direction with respect to the opening portion and second supporting grooves opposing each other in the second direction with respect to the opening portion, and
the opposing ends of the first support are respectively inserted in the first supporting grooves,
the opposing ends of the second support are respectively inserted in the second supporting grooves, and
from a same surface of the frame which faces the mask stick, a depth of the first supporting grooves is less than that of the second supporting grooves.

10. The mask frame assembly of claim 7, wherein a length of the first support in the first direction is greater than a length of the second support in the second direction.

11. The mask frame assembly of claim 1, wherein the mask stick comprises a ferromagnetic material.

12. The mask frame assembly of claim 2, wherein the first support together with the magnet between the same one of the deposition region of the mask stick and the first support divides the same one of the deposition region into a plurality of deposition areas spaced apart from each other along the second direction, the plurality of deposition areas corresponding to the plurality of display regions of the substrate.

* * * * *